United States Patent [19]
Torreno, Jr.

[11] 3,995,309
[45] Nov. 30, 1976

[54] ISOLATION JUNCTIONS FOR SEMICONDUCTOR DEVICES

[75] Inventor: Manuel L. Torreno, Jr., Elnora, N.Y.

[73] Assignee: General Electric Company, Schenectady, N.Y.

[22] Filed: Nov. 1, 1974

[21] Appl. No.: 519,914

Related U.S. Application Data

[63] Continuation-in-part of Ser. No. 411,012, Oct. 30, 1973, abandoned.

[52] U.S. Cl. .................................. 357/48; 357/47; 357/60; 357/88; 357/89; 357/90
[51] Int. Cl.² ................ H01L 27/02; H01L 27/04; H01L 29/04
[58] Field of Search ............... 357/48, 47, 60, 88, 357/89, 90

[56] References Cited

UNITED STATES PATENTS

| | | | |
|---|---|---|---|
| 2,813,048 | 11/1957 | Pfann | 357/60 |
| 3,617,399 | 11/1971 | Fowler | 357/48 |
| 3,624,467 | 11/1971 | Bean | 357/48 |
| 3,656,028 | 4/1972 | Langdon | 357/48 |
| 3,769,105 | 10/1973 | Chen | 357/48 |

Primary Examiner—Edward J. Wojciechowicz
Attorney, Agent, or Firm—Donald M. Winegar; Joseph T. Cohen; Jerome C. Squillaro

[57] ABSTRACT

Isolation junctions in semiconductor devices are formed by selected regions of specified conductivity wherein each region has a substantially uniform thickness and resistivity throughout the region. The material of the selected regions is recrystallized semiconductor material with solid solubility of the dopant impurity.

35 Claims, 7 Drawing Figures

ISOLATION JUNCTIONS FOR SEMICONDUCTOR DEVICES

CROSS-REFERENCE TO RELATED PATENT APPLICATION

This invention is a continuation-in-part of my patent application, Ser. No. 411,012, filed Oct. 30, 1973, now abandoned and assigned to the same assignee as the present invention.

BACKGROUND OF THE INVENTION

1. Field of the Invention

This invention relates to isolation junctions for semiconductor devices.

2. BACKGROUND OF THE INVENTION

Integrated circuits and related semiconductor devices depend on electrical isolation of one component from another. The most common isolation technique for devices made in the same semiconductor wafer is a diffused region of conductivity type which is opposite to that of the bulk of the device. This results in back-to-back P-N junctions interposed between the devices. This process is usually accomplished by solid state diffusion of selected impurities in a pattern between the devices requiring isolation. The diffused isolation regions are tapered with the widest portion being at the surface through which the diffusion operation is performed. Consequently, the available surface area for component manufacture is reduced in size. Additionally, the diffused regions do not have a constant resistivity throughout the diffused region and the resulting P-N junctions formed thereby are not always a step junction. Occasionally, deep electrical isolation junctions require diffusion of impurities through opposed surfaces of the device. This requires extra process steps. In any instance, however, junction isolation of such devices requires high temperatures and extended furnace times such, for example, as 1250° C for 3 days. High carrier lifetime and crystalline perfection of substrate material are degraded in spite of extensive efforts made to preserve them. Lateral diffusion during formation of the isolation junctions wastes a large volume of the substrate which could be used for device fabrication.

Other electrical isolation techniques involves selective etching of the substrate material of the device and growing or depositing silicon oxide in the etched portion of the substrate.

An object of this invention is to provide a new and improved junction isolation means in semiconductor devices which overcome the deficiencies of the prior art.

Another object of this invention is to provide a new and improved junction isolation means in a semiconductor device which optimizes the volume of substrate material available for device and circuit fabrication.

Another object of this invention is to provide a new and improved junction isolation means in a semiconductor device wherein the isolation region is substantially uniform in thickness and resistivity throughout the region.

A further object of this invention is to provide a new and improved junction isolation means in a semiconductor device wherein post diffusion of the P-N junction is practiced to alter the step junction to a graded junction.

BRIEF DESCRIPTION OF THE INVENTION

In accordance with the teachings of this invention, there is provided a semiconductor device comprising a body of semiconductor material having a selected resistivity, a first type conductivity, two major opposed surfaces forming the top and bottom surfaces of the body and a peripheral side surface. At least one region of second and opposite type conductivity is disposed in the body and extends between, and terminates in, the top and bottom surfaces of the body. The material of at least one region of second type conductivity is recrystallized semiconductor material of the body and has a dopant impurity therein, the concentration of which is sufficient to impart the second type conductivity. The recrystallized material has solid solubility of the impurity contained therein. At least one region divides the body into at least two regions of first type conductivity which are electrically isolated from each other. Each region of first type conductivity has top and bottom surfaces which are coextensive with the respective top and bottom surfaces of the body. A P-N junction is formed by the contiguous surfaces of each pair of regions of opposite type conductivity and is an isolation junction for the body. The P-N junction, formed as the result of the thermal gradient zone melting process is a step junction. In particular, the thermal migration of aluminum "wires" through a body of N-type silicon will produce the desired structure.

A configuration which is preferred for isolation means between semiconductor memory arrays and for the manufacture of individual chips embodies two groups of planar regions of second type conductivity in a body of material of a first type conductivity. The arrangement of the two groups is such as to present an egg crate configuration in the body.

A post thermal gradient zone melting heat treatment is practiced on the step junction to provide a graded P-N junction as required.

As required, electrical passivating material is disposed on selective surface areas of the body and exposed P-N junctions contained therein.

DESCRIPTION OF THE INVENTION

Figure 1:
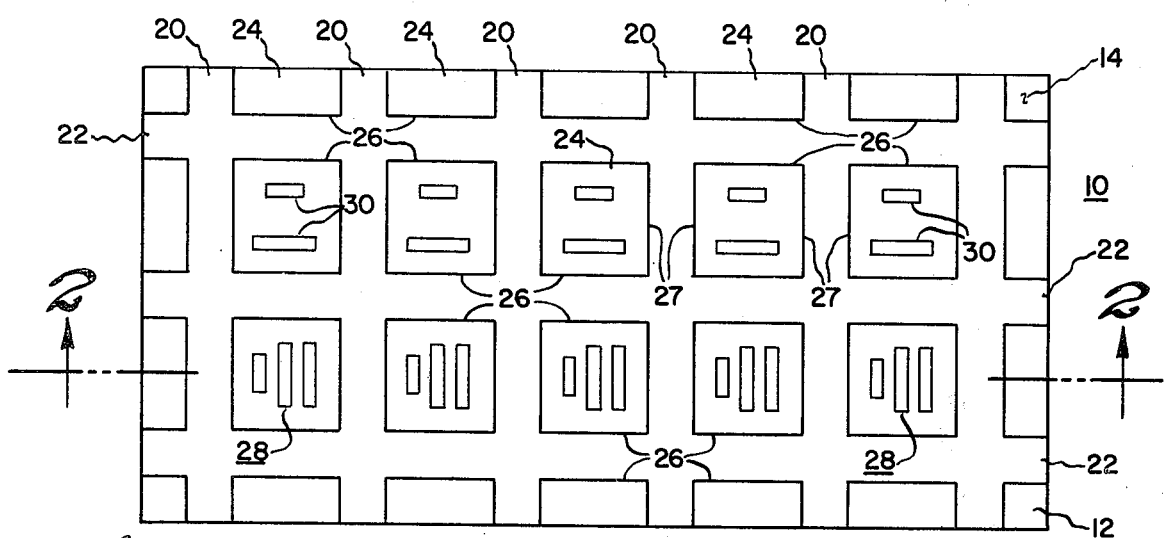
FIG. 1 is a top planar view of a semiconductor device embodying the isolation junctions of this invention.
Figure 2:
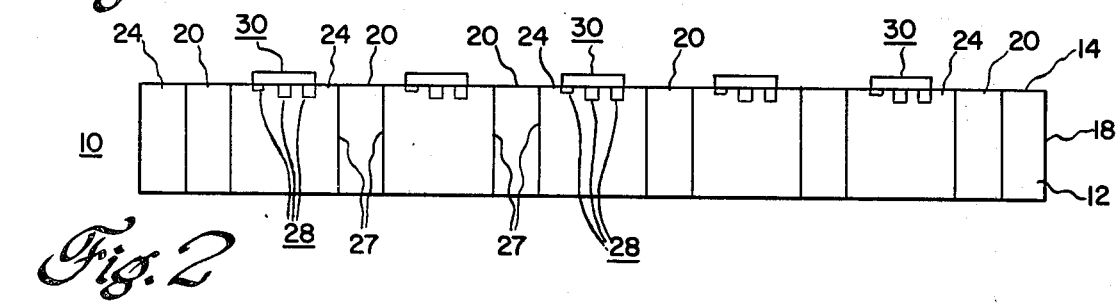
FIG. 2 is an elevation view, in cross-section, of the device in FIG. 1 taken along the cutting planes II—II.

Referring to FIGS. 1 and 2 there is shown a semiconductor device 10 comprising a body 12 of semiconductor material having a selected resistivity and a first type conductivity. The semiconductor material comprising the body 12 may be silicon, germanium, silicon carbide, a compound of a Group II element and Group VI element and a compound of a Group III element and a Group V element. The body 12 has two major surfaces 14 and 16, which define the top and bottom surfaces thereof respectively, and a peripheral side surface 18.

A plurality of first spaced planar regions 20 are disposed in the body 12 substantially parallel to each other. Preferably, each of the regions 20 is oriented substantially perpendicular to the top and bottom surfaces, 14 and 16 respectively, and the peripheral side surface 18. Each of the regions 20 has a peripheral side surface which is coextensive with the respective surfaces 14, 16 and 18 of the body 12. A P-N junction 27 is formed by the contiguous surfaces of each region 20 and the immediately adjacent material of the body 12.

A plurality of second spaced planar regions 22 are disposed in the body 12 substantially parallel to each other. Preferably, each of the regions 22 is oriented substantially perpendicular to the respective top and bottom surfaces, 14 and 16 and the side surface 18. In addition, each of the regions 22 is perpendicular to, intersects, and is integral with the plurality of first spaced planar regions 20. Each of the second planar regions 22 has a peripheral side surface which is coextensive with the surfaces 14, 16 and 18 of the body 12. A P-N junction 26 is formed by the contiguous surfaces of each region 22 and the immediately adjacent material of the body 12. The integral, intersecting planar regions 20 and 22 define an egg crate configuratin which divides the body 12 into a plurality of third regions 24 of first type conductivity. The regions 24 are electrically isolated from each other by the P-N junctions 26 and 27.

Preferably, each of the regions 20 and 22 are of the same type conductivity, the conductivity being of a second, and opposite type, than that conductivity of the body 12 and the regions 24. Temperature gradient zone melting is the preferred process means for forming the regions 20 and 22 in the body 12. The material of the planar regions 20 and 22 comprises recrystallized material of the body 12 having a concentration of an impurity constituent which imparts the second, and opposite type, conductivity thereto. It is recrystallized material with solid solubility of the impurity therein. It is not a recystallized material with liquid solubility of the impurity. Neither is it a eutectic material in the recrystallized material and it is not an alloy of the impurity and the semiconductor material. Each of the planar regions 20 and 22 has a substantially uniform resistivity throughout its entire region. The width of each of the regions 20 and 22 is substantially constant over the entire region and is determined by whatever photomasking geometry is used to define the regions 20 and 22. In particular, the body 12 may be of silicon semiconductor material of N-type conductivity and the regions 22 and 24 are aluminum doped recrystallized silicon to form the required P-type conductivity regions. For a complete description of how the planar regions 20 and 22 are formed in the body 12 attention is drawn to the copending application of Thomas R. Anthony and Harvey E. Cline entitled "Thermomigration" of Metal-Rich Liquid Wires Through Semiconductor "Materials" filed on Oct. 30, 1973, assigned to the same assignee as this invention and having the Ser. No. 411,018 now U.S. Pat. No. 3,899,362.

The P-N junctions 27 and 26 are well defined and show an abrupt transition from one region of conductivity to the next adjacent region of opposite type conductivity. The abrupt transition produces a step P-N junction.

The plurality of planar regions 20 and 22 electrically isolate each region 24 from all of the remaining regions 24 by the back-to-back relationship of the respective segments of the P-N junctions 27 and 26. The electrical isolation achieved by this novel egg-crate design enables one to associate one or more semiconductor devices with one or more of the plurality of regions 24 of first type conductivity. The devices may be planar semiconductor devices 28 formed in mutually adjacent regions 24 and/or mesa semiconductor devices 30 formed on mutually adjacent regions 24 and still protect the electrical integrity of each device 28 or 30 without disturbing devices in the mutually adjacent regions 24. Devices 28 and 30 may, however, be electrically interconnected to produce integrated circuits and the like. Additionally, the devices 28 and 30 may be individual devices and the regions 20 and 22 provide suitable means for scribing and breaking the body 12 into a plurality of individual chips.

The spaced planar regions 20 and 22 besides offering excellent electrical isolation between mutually adjacent regions 24 have several other distinct advantages over prior art electrical isolation regions. Each of the regions 20 and 22 have a substantially constant uniform width and a substantially constant uniform level of impurity concentration for its entire length. In addition, the planar regions 20 and 22 may be fabricated before or after the fabrication of the basic devices 28 and 30. Preferably, the regions 20 and 22 are fabricated after the highest temperature process step necessary for the fabrication of the devices 28 and 30 has been practiced first. This preferred practice limits, or substantially eliminates, any sideways diffusion of the impurity of the regions 20 and 22 which tends to increase the width of the regions 20 and 22 and thereby decrease the abruptness of the P-N junction and the transition between the opposite type conductivity regions. However, should a graded P-N junction be desired, a post "wire" migration heat treatment may be practiced for an elapsed time sufficient to obtain the desired width of a graded P-N junction. Further, the planar regions 20 and 22 maximize the volume of the body 12 which can be utilized for functional electrical devices to a greater extent than can be achieved by prior art devices.

Figure 3:
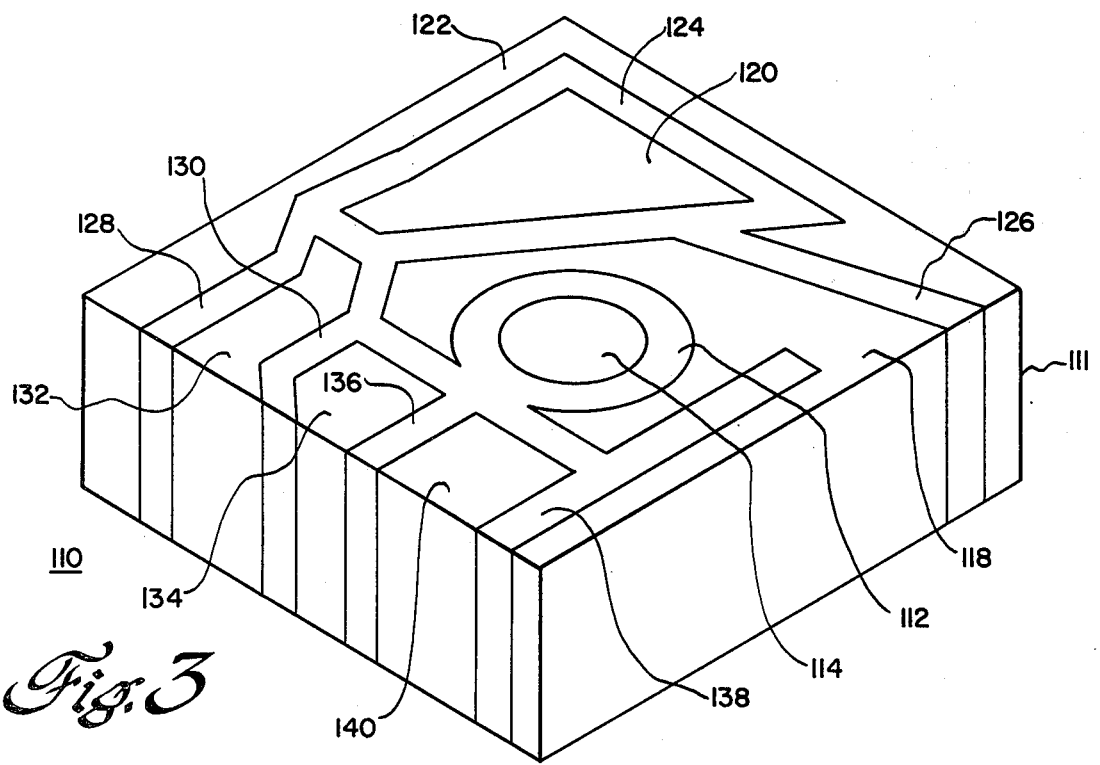
FIG. 3 is an isometric view of a body of semiconductor material embodying isolation junctions made in accordance with the teachings of this invention.

The planar regions 20 and 22 shown and described as isolation junction means most likely will find extensive use in integrated circuit fabrication and the like. However, such preferred geometry of the isolation junction is not the only configuration for such isolation junction means. Referring now to FIG. 3 there is shown a semiconductor device 110 embodying a plurality of isolation junction means formed in a body 111 of single crystal semiconductor material and also made in accordance with the teachings of this invention. Isolation junction means may be substantially toroidal as indicated by the region 112 of a second and opposite type conductivity which electrically isolates a region 114 of first type conductivity from a region 118 of first type conductivity. Regions 120 and 122 of first type conductivity are electrically isolated from each other by a region 124 of second and opposite type conductivity. Regions 126 of second type conductivity electrically isolates a selected portion of the region 122 from the region 118. Regions 128 and 130 of second type conductivity electrically isolate a region 132 of first type conductivity from a selected portion of the region 122 and a region 134, both being of first type conductivity. Regions 136 and 138 of second type conductivity electrically isolate a region 140 of first type conductivity from a selected portion of the region 198. Region 142 of second type conductivity is integral with the regions 112, 124, 130, 136 and 138 and electrically isolates selected portions of the region 118 from regions 132, 134, and 140 and 112 from 140. The device 110 thus illustrates that electrical isolation junction means need not always be perpendicular to or parallel to each other or be of any specific geometric shape. The line directions and angle of intersection between intersecting planar regions are determined by the preferred planar orientation of the at least the surface 14 and in accordance with the data of the Table.

A thorough discussion of the migration of metal "wires" relative to planar orientation for a surface of a body of semiconductor material and the preferred axis of migration is found in a copending application "Method of Making Isolation Grids in Bodies of Semiconductor Material", Ser. No. 411,022, filed on Oct. 30, 1973 and now U.S. Pat. No. 3,904,442, and assigned to the same assignee of this invention.

The migration of metal wires is preferably practiced in accordance with preferred planar orientations of a surface of a body of semiconductor material, preferred migration axes, stable wire directions and stable wire sizes of the following Table:

Table

| Wafer Plane | Migration Direction | | Stable Wire Directions | Stable Wire Sizes |
|---|---|---|---|---|
| (100) | <100> | | <011>* | <100 microns |
| | | | <0$\bar{1}$1>* | <100 microns |
| (110) | <110> | | <1$\bar{1}$0>* | <150 microns |
| (111) | <111> | +a) | <01$\bar{1}$> | |
| | | | <10$\bar{1}$> | <500 microns |
| | | | <$\bar{1}$10> | |
| | | b) | <11$\bar{2}$>* | — |
| | | | <$\bar{2}$11>* | <500 microns |
| | | | <1$\bar{2}$1>* | |
| | | c) | Any other* direction in (111) plane* | <500 microns |

*The stability of the migrating wire is sensitive to the alignment of the thermal gradient with the <100>, <110> and <111> axis, respectively.
+Group a is more stable than group b which is more stable than group c.

So far the novel electrical isolation regions for semiconductor devices has been described wherein the regions were isolated from each adjacent region but electrical contacts could conceivably be from either the top or the bottom surface as required.

Figure 4:
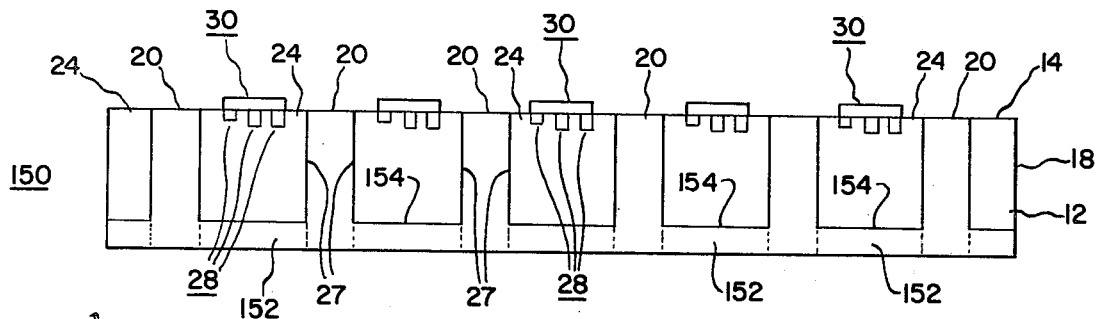
FIG. 4 is an elevation view, in cross-section, of an alternate embodiment of the device of FIG. 1 made in accordance with the teachings of this invention.

Referring now to FIG. 4, there is shown a device 150 which is an alternate embodiment of the device 10 of FIGS. 1 and 2. Each element of the device 150 denoted by the same reference numeral as an element in the device 10 is the same, and functions in exactly the same manner, as that element of the device 10 as previously described with reference to FIGS. 1 and 2. A region 152 of the same type conductivity as the regions 20 and 22 is formed in the bottom portion of the body 12 by suitable means known to those skilled in the art such, for example, as by diffusion, ion implantation and the like. Alternately, the region 152 may be grown by epitaxial techniques and the like. A plurality of P-N junctions 154 is formed by the contiguous surfaces of the material of each of the regions 24 and the region 152 of opposite type conductivity. Each junction 154 is integral with selected pair of junctions 27 and 26 (not shown — See FIG. 1) to electrically isolate each region 24 from mutually adjacent regions 24 and from the bottom surface 16 any amount affixed to surface 16. Ohmic electrical contacts to the either of the devices 28 or 30 are affixed thereto only via the vicinity of the top surface 14.

Figure 5:
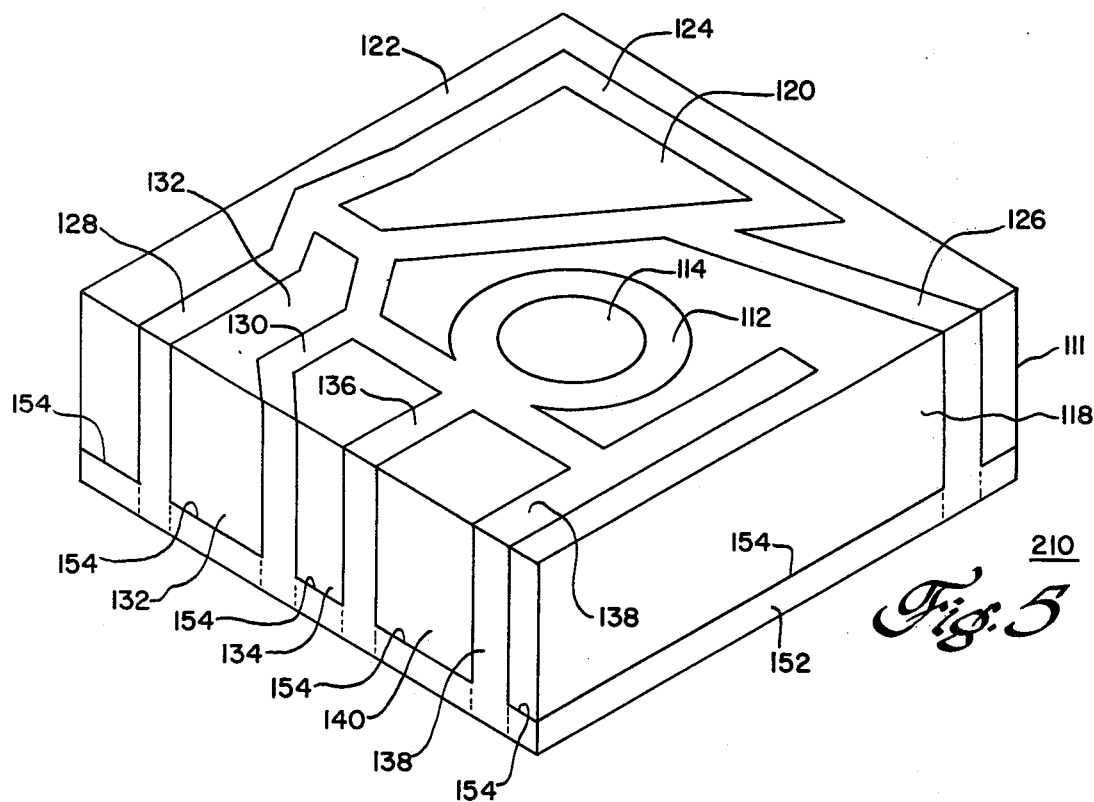
FIG. 5 is an isometric view of an alternate embodiment of the device of FIG. 3 made inaccordance with the teachings of this invention.

The region 152 must have sufficient level of resistivity to prevent premature breaking down of the junction 154 and short circuiting or other wise affecting detrimentally any electrical functioning of the associated region 24. The thickness of the region 152 may also be varied to protect the electrical integrity of the regions 54. With reference now to FIG. 5, there is shown a semiconductor device 210 embodying an electrical isolation grid which is a modification of the grid structure of the device 110 of FIG. 3. All elements of the device 210 denoted by the same reference numbers in the device 110 are the same, and functions in the same manner, as the element as previously described. A region 152 is formed in the body 111 in the same manner, and functions in the same manner co-operatively with the regions 124, 126, 128 and the like, of the same type conductivity, as the region 152 in the device 150 functions with the regions 20 and 22.

Figure 6:
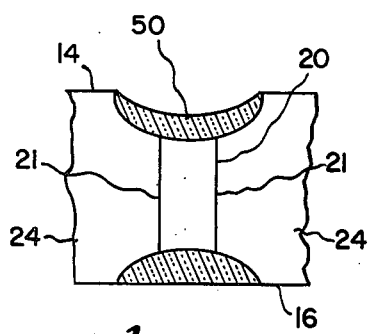
FIGS. 6 and 7 are partial views, in cross-section, of alternate means for passivating exposed portions of isolation junctions of this invention.

It may be ncessary to protect the exposed portions of any of the P-N junctions of any of the devices 10, 110, 150 and 210 in order to prevent leakage currents from shunting the electrically isolating P-N junctions and deleteriously affecting the functional operations of any of the semiconductor devices. For example, referring to FIGS. 6 and 7, two suitable methods are shown for protecting the exposed ends of the P-N junctions 21 of the device 10. In FIG. 6, selective etching is employed to etch away a portion of the surfaces 14 and 16 in the vicinity of a region 20 and the associated P-N junctions 21 to provide a trough-like depression in the surfaces 14 and 16. A layer 50 of a passivating material such, for example, as silicon oxide, silicon nitride, phosphosilicate glass, borosilicate glass and the like, is disposed within the etched surface areas 14 and 16 on selected surface areas thereof and the exposed portions of the P-N junctions 21. The layer 50 may be of a sufficient thickness to control current leakage and still not fill the etched out surface area of surface 14 or it may be of a sufficient thickness to completely fill the etched out surface area as shown relative to surface 16.

Figure 7:
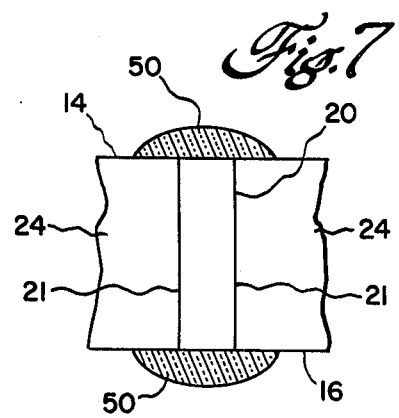

Referring now to FIG. 7, the surface areas 14 and 16 need not be selectively etched prior to the surface passivation process. The layer 50 of passivation material is disposed on selected areas of the surfaces 14 and 16 and the exposed P-N junctions 21 in the selected areas.

The invention has been described relative to practicing thermal gradient zone melting in a negative atmosphere. However, it has been discovered that when the body of semiconductor material is a thin wafer of the order of 10 mil thickness, the thermal gradient zone melting process may be practiced in an inert gaseous atmosphere of hydrogen, helium, argon, and the like in a furnace having a positive atmosphere. In addition, the electrical isolation regions may be formed in a positive atmosphere wherein a suitable source of radiant heating is employed for the migration process.

I claim as my device:
1. A semiconductor device comprising:
    a first region of first type conductivity semiconductor material having two opposed major surfaces, the surfaces being the top and bottom surfaces thereof and a preferred first level of resistivity;

a second region of second, and opposite type conductivity semiconductor material having two opposed major surfaces, the surfaces being the top and bottom surfaces thereof and a second level of resistivity;

the top surface of the second region being coextensive and contiguous with the bottom surface of the first region;

a first P-N junction formed by the contiguous surfaces of the first and second regions of opposite type conductivity;

the first and second regions comprising a body of single crystal semiconductor material, the top surface of the first region being the top surface of the body the bottom surface of the second region being the bottom surface of the body;

the top surface having a crystal planar orientation which is one selected from the group consisting of (110), (100) and (111);

the body having a vertical axis which is aligned substantially parallel with a first crystal axis of the material of the body;

at least one third region of recrystallized semiconductor material of the body having second type conductivity formed in the body and extending into the body from the top surface thereof through the entire first region to at least intersect the first P-N junction to become integral with the second region, to divide the first region into a plurality of fourth regions, each of which has first type conductivity;

each of the third regions having a vertical axis which is substantially parallel with the first preferred crystal axis of the material of the body and the vertical axis of the body;

the recrystallized material of each of the third regions being formed in situ in the body by the migration of a melt of metal-rich semiconductor material of the body through the material of the body by thermal gradient zone melting at a predetermined elevated temperature along a thermal gradient established substantially parallel with both the preferred first crystal axis of the material and the vertical axis of the body and having a predetermined level of resistivity as determined by the solid solubility limit of that metal in that semiconductor material at that predetermined elevated temperature of migration, the metal being distributed substantially uniformly throughout the entire third region and the metal includes at least one dopant impurity material therein to impart the type conductivity and level of resistivity thereto, and a plurality of second P-N junctions, each second P-N junction being formed by the contiguous surfaces of the material of each pair of abutting third and first regions of opposite type conductivity, each second P-N junction intersecting and being integral with the first P-N junction.

2. The semiconductor device of claim 1 wherein each of the third regions has a substantially uniform width throughout each region.

3. The semiconductor device of claim 2 wherein each of the third regions has an annular configuration.

4. The semiconductor device of claim 3 wherein the semiconductor material is one selected from the group consisting of silicon, silicon carbide, germanium and gallium arsenide.

5. The semiconductor device of claim 4 wherein the semiconductor material is silicon of N-type conductivity, and
the dopant impurity material is aluminum.

6. The semiconductor device of claim 1 wherein each of the third regions is a planar region which is oriented in a preferred wire direction which is substantially parallel with a preferred second axis of the material of the semiconductor material of the body.

7. The semiconductor device of claim 6 wherein the semiconductor material is one selected from the group consisting of silicon, silicon carbide, germanium and gallium arsenide.

8. The semiconductor device of claim 7 wherein the semiconductor material is silicon of N-type conductivity, and
the dopant impurity material is aluminum.

9. The semiconductor device of claim 6 wherein the preferred crystal planar orientation is (111), and the first preferred crystal axis is <111>.

10. The semiconductor device of claim 9 wherein the preferred second axis is one selected from the group consisting of <$11\bar{2}$>, <$\bar{2}11$>, <$1\bar{2}1$>, <$01\bar{1}$>, <$1\bar{0}1$> and <$1\bar{1}0$>.

11. The semiconductor device of claim 10 wherein the semiconductor material is silicon of N-type conductivity, and
the dopant impurity material is aluminum.

12. The semiconductor device of claim 6 wherein the preferred crystal planar orientation is (100), the preferred first crystal axis is <100>, and the preferred second crystal axis is one selected from the group consisting of <011> and <$0\bar{1}1$>.

13. The semiconductor device of claim 12 wherein the semiconductor material is silicon of N-type conductivity, and
the dopant impurity material is aluminum.

14. The semiconductor device of claim 6 wherein the preferred planar crystal orientation is (110), the first preferred crystal axis is <110>, and the second preferred crystal axis is <$1\bar{1}0$>.

15. The semiconductor device of claim 14 wherein the semiconductor material is silicon of N-type conductivity, and
the dopant impurity material is aluminum.

16. The semiconductor device of claim 15 wherein each of the at least one third and the at least one fourth regions has a substantially uniform width throughout each region.

17. The semiconductor device of claim 16 wherein the semiconductor material is one selected from the group consisting of silicon, silicon carbide, germanium and gallium arsenide.

18. The semiconductor device of claim 17 wherein the semiconductor material is silicon of N-type conductivity, and
the dopant impurity material is aluminum.

19. The semiconductor device of claim 16 wherein the predetermined angle between each fourth region and a third region is substantially 90°.

20. The semiconductor device of claim 18 wherein each of the third and fourth regions extends entirely through the first and second regions and terminates in the top and bottom surfaces.

21. The semiconductor device of claim 20 wherein the preferred crystal planar orientation is (100); the preferred first crystal axis is <100>; the preferred second crystal axis is <011>, and the preferred third crystal axis is <0$\bar{1}$1>.

22. The semiconductor device of claim 16 wherein at least one electrical device is fabricated in one of the unit cells of the first region.

23. The semiconductor device of claim 19 wherein at least one electrical device is fabricated in one of the unit cells of the first region.

24. The semiconductor device of claim 1 including at least one fourth region of recrystallized semiconductor material of the body having second type conductivity formed in the body and extending into the body from the top surface thereof through the entire first region to at least intersect the first P-N junction to become integral with the second region and to at least intersect one second P-N junction to become integral with at least one third region;

each of the fourth regions having a vertical axis which is substantially parallel with the first preferred crystal axis of the material of the body and the vertical axis of the body;

the recrystallized material of each of the fourth regions being formed in situ in the body by the migration of a melt of metal-rich semiconductor material of the body through the material of the body by thermal gradient zone melting at a predetermined elevated temperature along a thermal gradient established substantially parallel with both the preferred first crystal axis of the material and the vertical axis of the body and having a predetermined level of resistivity as determined by the solid solubility limit of that metal in that semiconductor material at that predetermined elevated temperature of migration, the metal being distributed substantially uniformly throughout the entire fourth region and the metal includes at least one dopant impurity material therein to impart the type conductivity and level of resistivity thereto;

each fourth region intersecting the at least one third region at a predetermined angle, and a plurality of third P-N junctions, each P-N junction being formed by the contiguous surfaces of the material of each pair of abutting fourth and first regions of opposite type conductivity, each third P-N junction intersecting and being integral in part with the first and at least one second P-N junctions to divide the first region into a plurality of unit cells of semiconductor material of the first region, each cell being electrically isolated from each other and the bottom surface of the body by the mutually adjacent portions of the second, third and fourth regions and the associated portions of the first, second and third P-N junctions.

25. The semiconductor device of claim 24 wherein the preferred crystal planar orientation is (111), the preferred first crystal axis is <111>;

the preferred second crystal axis is one selected from the group consisting of <11$\bar{2}$>, <$\bar{2}$11>, <1$\bar{2}$1>, <01$\bar{1}$>, <10$\bar{1}$> and <1$\bar{1}$0>, and the preferred third crystal axis is one which is substantially perpendicular to the preferred second crystal axis.

26. The semiconductor device of claim 25 wherein the semiconductor material of the body is one selected from the group consisting of silicon, silicon carbide, germanium and gallium arsenide.

27. The semiconductor device of claim 26 wherein the semiconductor material is silicon of N-type conductivity, and the dopant impurity material is aluminum.

28. The semiconductor device of claim 25 wherein the semiconductor material of the body is one selected from the group consisting of silicon, silicon carbide, germanium and gallium arsenide.

29. The semiconductor device of claim 26 wherein the semiconductor material is silicon of N-type conductivity, and the dopant impurity material is aluminum.

30. The semiconductor device of claim 27 wherein the preferred crystal planar orientation is (100);

the preferred first crystal axis is <100>;

the preferred second crystal axis is <011>, and the preferred third crystal axis is <0$\bar{1}$1>.

31. The semiconductor device of claim 25 wherein the second and third P-N junctions are step junctions.

32. The semiconductor device of claim 25 wherein the second and third P-N junctions are graded junctions.

33. The semiconductor device of claim 30 wherein the second and third P-N junctions are step junctions.

34. The semiconductor device of claim 30 wherein the second and third P-N junctions are graded junctions.

35. The semiconductor device of claim 24 including a plurality of third regions disposed in the body as an array of spaced planar regions substantially parallel with each other, a plurality of fourth regions disposed in the body as an array of spaced planar regions substantially parallel with each other and substantially perpendicular to the planar third regions, and each of the planar regions is oriented in a preferred wire direction which is substantially parallel with a preferred third crystal axis of the semiconductor material of the body.

* * * * *